United States Patent [19]
Kirk

[11] Patent Number: 5,495,391
[45] Date of Patent: Feb. 27, 1996

[54] COMPUTER HAVING AN EJECTOR MECHANISM OPERABLE FROM A SIDE OPPOSITE A MEMORY CARD SLOT

[75] Inventor: Richard D. Kirk, Lake Worth, Fla.

[73] Assignee: International Business Machines Corporation, Armonk, N.Y.

[21] Appl. No.: 264,819

[22] Filed: Jun. 23, 1994

[51] Int. Cl.⁶ .............................. G06F 1/16; H05K 7/10; H01R 13/62
[52] U.S. Cl. .......................... 361/684; 361/754; 439/159
[58] Field of Search ..................... 439/152, 155, 439/159, 160; 364/708.1; 361/684, 686, 754, 785, 798

[56] References Cited

U.S. PATENT DOCUMENTS

| | | | |
|---|---|---|---|
| 3,609,333 | 9/1971 | Fujisawa-shi | 439/159 X |
| 4,952,161 | 8/1990 | Komatsu | 439/155 |
| 5,011,420 | 4/1991 | Sakamoto | 439/152 |
| 5,283,714 | 2/1994 | Tsai et al. | 439/160 X |

FOREIGN PATENT DOCUMENTS 64-76690  3/1989  Japan ............................ H01R 23/00

*Primary Examiner*—Michael W. Phillips
*Attorney, Agent, or Firm*—Anthony N. Magistrale; Daniel E. McConnell

[57] ABSTRACT

Disclosed is a hand held computer having a housing. The housing has a first side and a second side wherein the second side is opposite the first side. A display and a processor are included in the housing. There is an opening in the first side of the housing for receiving a memory card. A connector is mounted within the housing for connecting the memory card to the processor. An ejector mechanism is operable from outside the housing from the second side to eject the memory card from the connector. The ejector mechanism has a bar that spreads the ejection force to both corners of the card nearest the connector so as to provide balanced ejection force to eject the card without damage to the connector contacts. The bar is moved by a button which is held captive in the second side of the housing. The button transmits the force provided by a user's finger to the bar.

15 Claims, 4 Drawing Sheets

COMPUTER HAVING AN EJECTOR MECHANISM OPERABLE FROM A SIDE OPPOSITE A MEMORY CARD SLOT

BACKGROUND OF THE INVENTION

This invention relates to small computers and similar electronic devices of the type that can be held in a user's hand and which employ Personal Computer Memory Card International Association (PCMCIA) cards.

The use of replaceable memory cards instead of diskettes or other Direct Access Storage Devices (DASD) is becoming more common since 1990 when the PCMCIA standard was first published. Computers are being designed with slots to accept the PCMCIA cards and guide them into specially designed connectors. Some connectors are being designed with mechanisms that eject the card when a button located alongside of the card slot is pushed. Without this type of mechanism, the PCMCIA card must be partially exposed after insertion in order that it can be gripped by a user for removal. The exposure leaves the card vulnerable to damage, especially in small hand held computers which are more susceptible to being bumped or dropped as they are carried about on car seats and in briefcases.

U.S. Pat. No. 4,952,161 teaches a dual card connector that includes a pair of buttons 8, each operative through a pivoting link to actuate one of a pair of sliders to eject one of the cards.

U.S. Pat. No. 5,011,420 teaches a card connector having an ejection mechanism that operates through a pivoting link to pull on a U shaped part that engages the card.

Japanese Patent 64-76690 shows a similar button 36 which operates through a lever 33 to move a cam against the contacts 12 and raise them from the card detent 21. What appears to be a spring 17 drives the card outwardly between a pair of retarding shutters 34. The shutters keep the card from falling out as it is being ejected.

One serious drawback of the known ejector mechanisms is that they occupy space adjacent to the slot which is at a premium, especially in hand held computers. Another is that they are complex and add cost to a product that is sold in a cost sensitive market.

SUMMARY OF THE INVENTION

These problems of space, complexity and cost are much reduced by the use of the instant invention which employs only two simple moving parts that operate from the rear of the card connector. These features are especially advantageous in hand held devices such as computers and other information handling apparatus where space near the card slot is limited and the dimensions are such that the distance from the rear of the card connector to the device housing is not great.

DESCRIPTION OF THE PREFERRED EMBODIMENTS(s)

Figure 1:
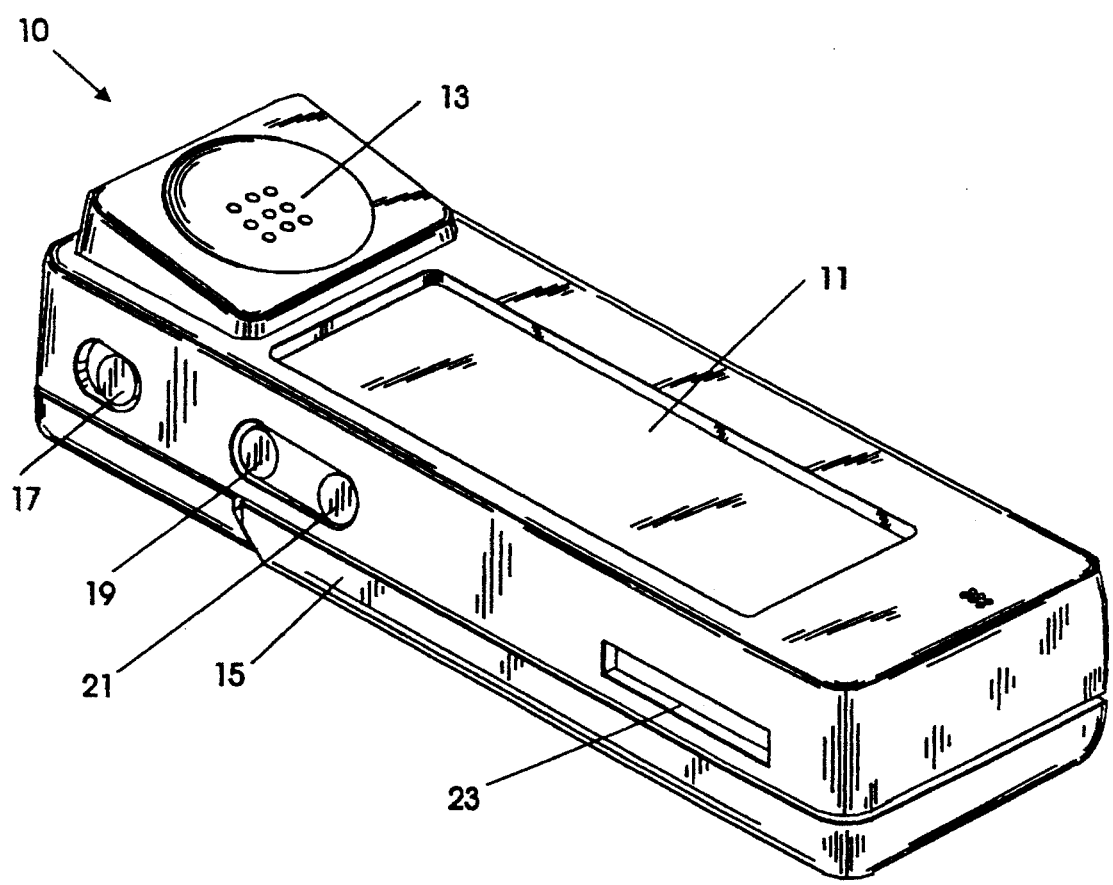
FIG. 1 shows a computer according to the invention.

FIG. 1 shows an example computer 10 according to the invention. Computer 10 has a Liquid Crystal Diode display/touch screen 11 and an audio transducer 13 mounted in a housing having a width that is of the same order but greater than the length of the card. A removable back panel 15 is provided in the housing in order to replenish the main battery. Several control buttons are located along each side of the unit. These buttons control such things as placing the unit into standby or into resume mode, changing audio volume, etc. Button 17 is the standby/resume switch. Button 19 increases volume and button 21 decreases volume.

At on end of the computer, a slot 23 is provided in communication with a PCMCIA card connector mounted inside of the computer. The slot is arranged in the side of the computer so that the back of the connector is adjacent to the other side of the computer in order to provide for the ejection mechanism of the invention. Since the dimensions of the housing are commensurate with the length of the PCMCIA card, the ejection mechanism may be mounted behind the card and not waste space.

Figure 2:
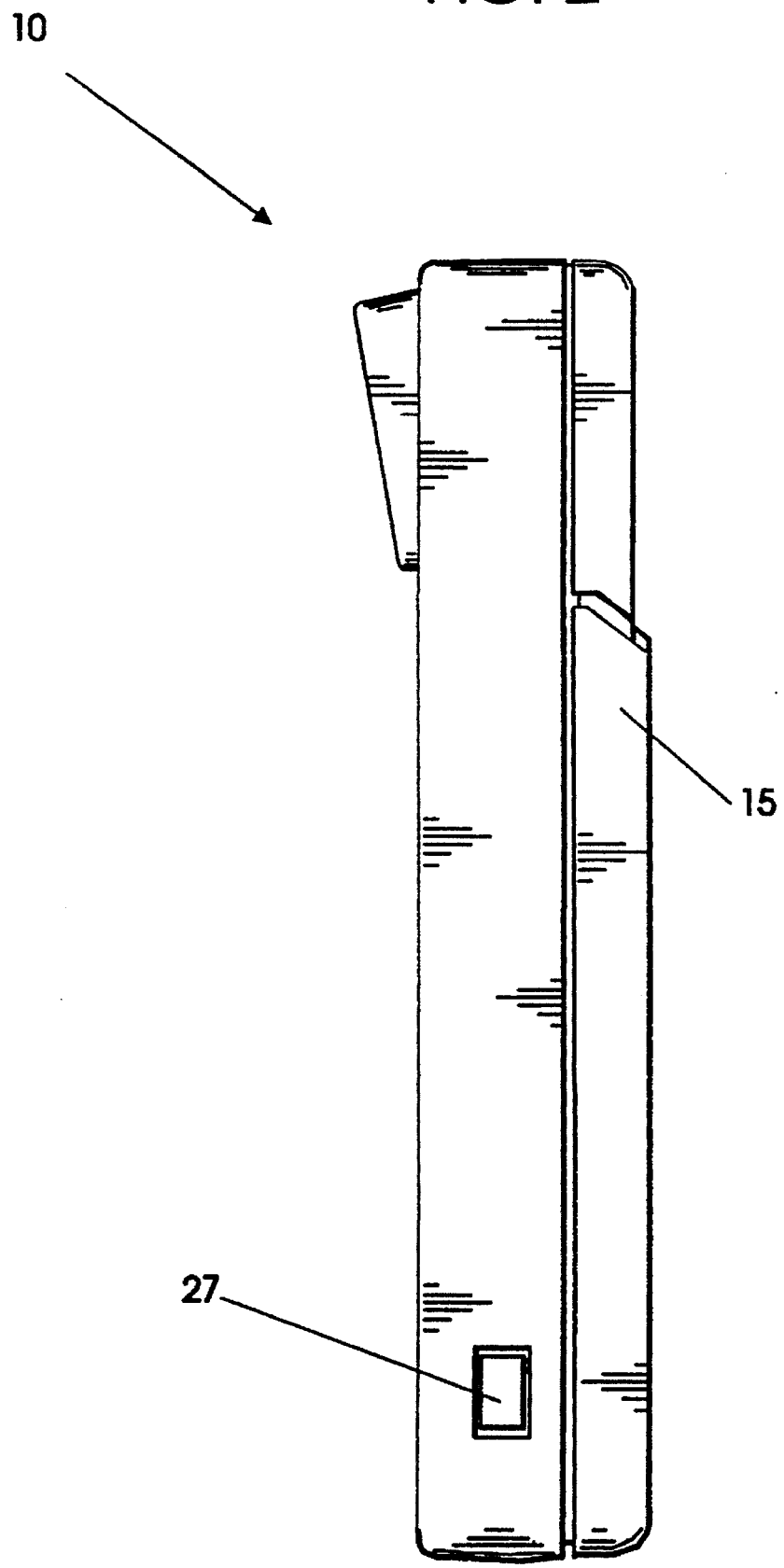
FIG. 2 is a right side view of the computer showing an ejector button in accordance with the invention.

FIG. 2 shows the right side of the housing of computer 10 which has an eject button 27 mounted therein in operating juxtaposition to the slot 23 in the left side of computer 10.

Figure 3:
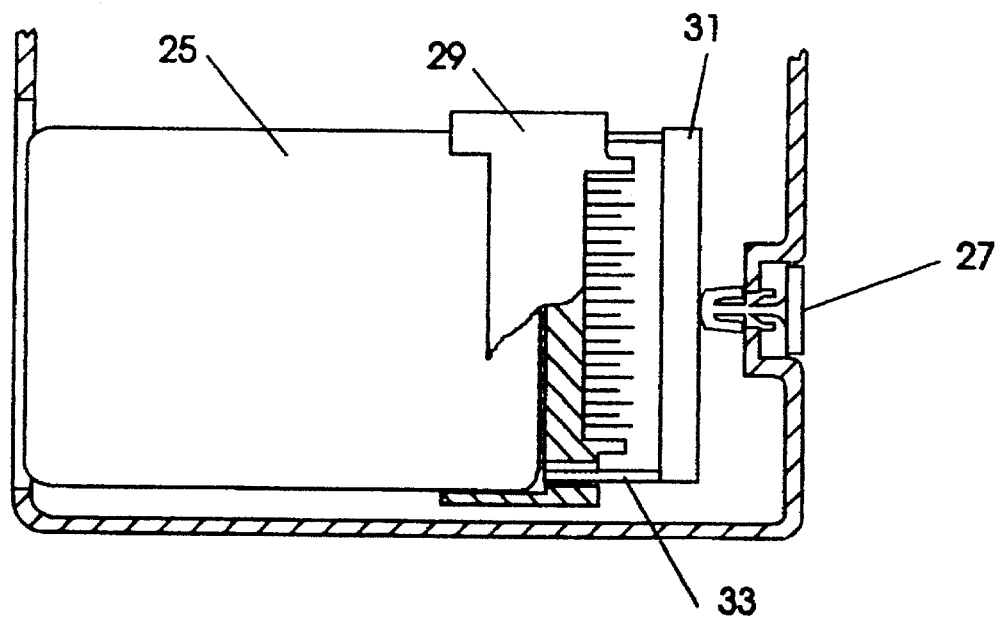
FIG. 3 is a top section view of computer showing the PCMCIA card connector and an ejector mechanism in accordance with the invention.

FIG. 3 is a section view through the lower portion of the computer 10 showing the PCMCIA card 25 inserted into the card connector 29. The lower portion of card connector 29 is cutaway along the section plane in order to more clearly show the leg 33 of ejector bar 31 in position to push the PCMCIA card out of the connector 29.

Figure 4:
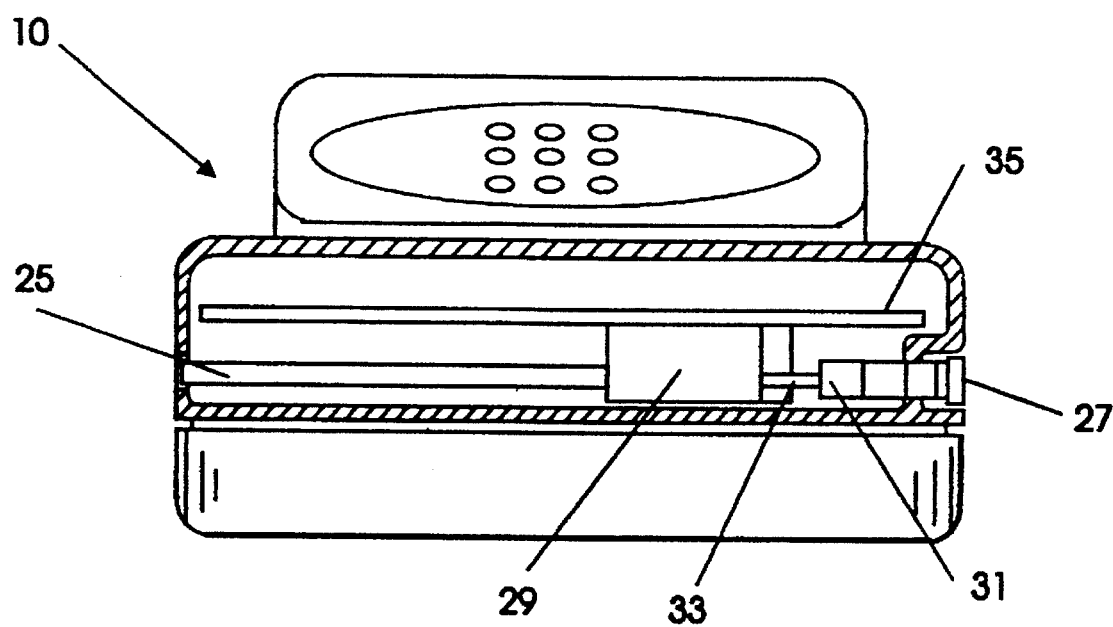
FIG. 4 is a side section view of the invention.

FIG. 4 is a cutaway view of the lower portion of the computer 10 showing the edge view of card 25 and the end view of connector 29. Connector 29 is mounted to the underside of circuit board 35 and connects the card to the operative elements of the computer. The operative elements in the preferred embodiment include a central processing unit for processing information, a memory for information storage, and information input/output devices and their controls such as touch display 11. Other elements such as a math co-processor may also be included. In the preferred embodiment, display 11 includes a touch screen which provides for information input by a computer user as well as the display of output information to the user.

As can be seen in the figure, the legs 33 of the ejector bar 31 lie in a plane that is substantially parallel to the plane wherein the card lies so that the ejector bar legs exert a relatively straight force on the card without significant force normal to the plane of the card. The ejector bar is moved against the card by the ejector button 27 which is shown in more detail in FIGS. 5, 6, and 7. The ejector button lies on a line that is substantially parallel to the lines of motion of both the card and the bar so that the button exerts force substantially in the ejection direction. The ejector bar and button are returned to their normal positions after ejecting a card by the pressure of a new card being inserted into the connector.

Alternately, in those embodiments where the housing must be wider and other apparatus must be mounted behind the connector 29, the legs of the bar may be made longer to straddle the other apparatus. In still another embodiment, the operative end of the button 27 may be elongated to pass between or through the other apparatus.

Figure 5:
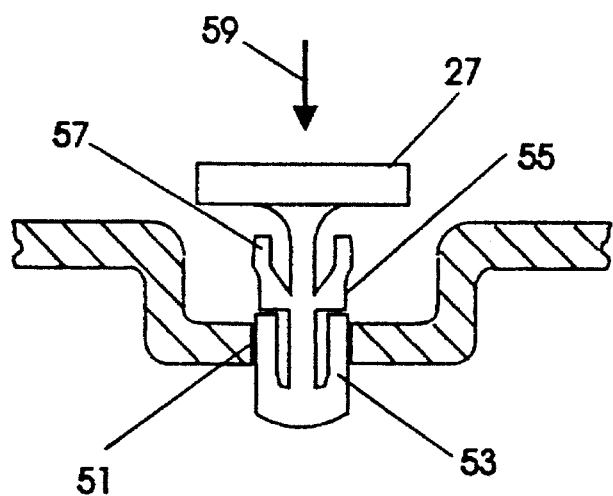
FIG. 5 shows how the ejector button is installed.

Referring now to FIG. 5, the eject button 27 is shown being pushed into the hole 51 in the cover 15 of the computer. As it moves into the hole 51, the elastic restraint wings 53 fold inward to allow passage. When the restraint wings 53 have fully entered the hole 51, they expand as shown in FIG. 6, due to the elasticity of the material and prevent the button from falling or being pulled back out of the hole.

Figure 6:
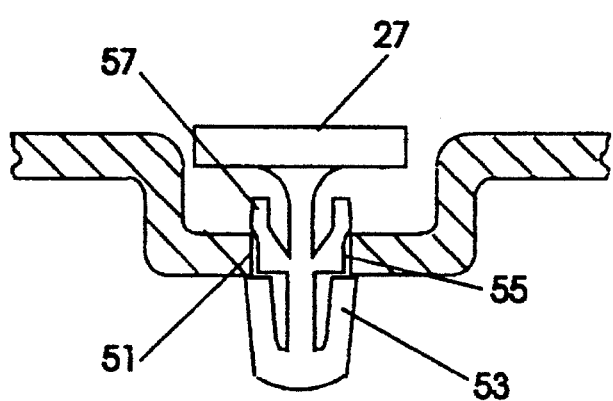
FIG. 6 shows the ejector button in its neutral position.

In FIG. 6, the button 27 has been pushed into the hole 51 up to the detent relief 55 in the detent wings 57. In this normal position, the button 27 is restrained from falling out by wings 53 and held from falling inward by the elastic resistance to folding that wings 57 provide. Assembly of the computer is facilitated by holding the button 27 in the normal position.

Figure 7:
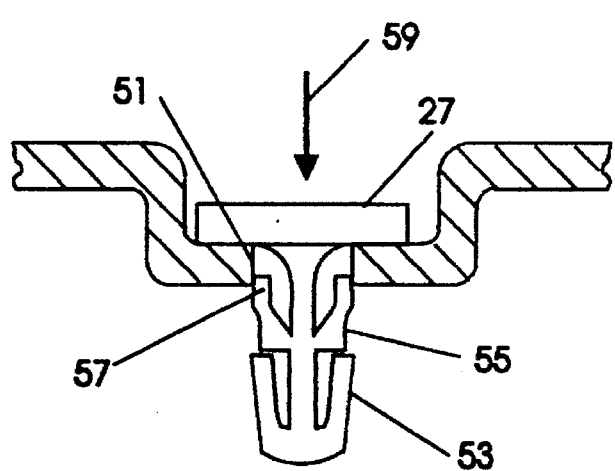
FIG. 7 shows the ejector button in its actuated position.

FIG. 7 shows the button after this resistance has been overcome by ejection pressure exerted by the user in order to move the button 27 along the line 59 and further inward and thereby move the legs 33 of ejector bar 31 to eject the card 25 from connector 29. The ejector bar and button are returned to their normal positions after ejecting a card by the pressure of a new card being inserted into the connector.

Having described the invention in terms of a preferred embodiment thereof, it will be recognized by those skilled in the art of computer input and output equipment design that various changes in the structure and operation of the implementation described can be made without departing from the spirit and scope of the invention which is measured by the following claims. Examples are adaptation of the invention to the ejection of cards or apparatus other than PCMCIA cards and/or replacing the wings of the ejection button with other forms of detent means.

What is claimed is:

1. A computer comprising:

a housing having a first side and a second side wherein said second side is opposite said first side, said housing being small enough to hold in a hand;

a display in said housing for displaying information;

a processor in said housing for processing information;

an opening in said first side of said housing for receiving a memory card;

a connector mounted within said housing for connecting said card to said processor of said computer;

an ejector mechanism operable from outside said housing from said second side to eject said card from said connector.

2. The computer of claim 1 wherein said ejector mechanism comprises:

an ejector bar having legs that operate in a plane substantially parallel to the plane of said card to push said card at least partially out of said housing.

3. The computer of claim 2 wherein said ejector mechanism further comprises:

a button captured at said second side, said button having an operating end which is operative to transmit force onto said ejector bar to push said card, said button having another end which is depressed by said user in order to provide said force.

4. The computer of claim 3 wherein said button further comprises:

a restraint for restraining said button in said housing, said restraint folding inward as said button is assembled into said housing.

5. The computer of claim 3 wherein said button further comprises:

a detent having a relieved area for holding said button in a normal position and having detent wings which fold inward as a user depresses said button.

6. An electronic device having operative elements, said device comprising:

a housing having a first side and a second side wherein said second side is opposite said first side, said housing being commensurate with the dimensions of a memory card;

an opening in said first side of said housing for receiving said memory card;

a connector mounted within said housing for connecting said card to said operative elements of said device;

an ejector mechanism operable from outside said housing from said second side to eject said card from said connector.

7. The device of claim 6 wherein said ejector mechanism comprises:

an ejector bar having contact points in the plane of said card to push said card at least partially out of said housing.

8. The device of claim 6 further comprising:

a button captured at said second side, said button having an operating end which is operative to transmit force onto said ejector bar to push said card, said button having another end which may be depressed by an operator in order to provide said force.

9. The device of claim 8 wherein said button further comprises:

a restraint for restraining said button in said housing, said restraint folding inward as said button is assembled into said housing.

10. The device of claim 8 wherein said button further comprises:

a detent having a relieved area for holding said button in a normal position and having detent wings which fold inward as a user depresses said button.

11. A housing for electronic apparatus comprising:

a first side and a second side wherein said second side is opposite said first side;

an opening in said first side of said housing for receiving a memory card;

a connector mounted within said housing for electrically connecting with a received memory card; and an ejector mechanism operable from outside said housing from said second side to eject said card from said connector.

12. The housing of claim 11 wherein said ejector mechanism comprises:

an ejector bar having legs that straddle said connector and electrical apparatus, said ejector bar operating in a plane substantially parallel to the plane of said card to push said card at least partially out of said housing.

13. The housing of claim 12 wherein said ejector mechanism further comprises:

a button captured at said side opposite, said button having an operating end which is operative to transmit force onto said ejector bar to push said card, said button having another end which is depressed by said user in order to provide said force.

14. The housing of claim 13 wherein said button further comprises:

a restraint for restraining said button in said housing, said restraint folding inward as said button is assembled into said housing.

15. The housing of claim 13 wherein said button further comprises:

a detent having a relieved area for holding said button in a normal position and having detent wings which fold inward as a user depresses said button.

* * * * *